US006087683A

United States Patent [19]

King et al.

[11] Patent Number: 6,087,683

[45] Date of Patent: Jul. 11, 2000

[54] SILICON GERMANIUM HETEROSTRUCTURE BIPOLAR TRANSISTOR WITH INDIUM DOPED BASE

[75] Inventors: Clifford A. King, New York, N.Y.; Isik C. Kizilyalli, Orlando, Fla.

[73] Assignee: Lucent Technologies, Murray Hill, N.J.

[21] Appl. No.: 09/127,373

[22] Filed: Jul. 31, 1998

[51] Int. Cl.[7] .......... H05B 35/00

[52] U.S. Cl. .......... 257/183; 438/341; 438/312; 257/197

[58] Field of Search .......... 438/202, 234, 438/309, 341, 312; 257/197, 565, 590, 592, 183

[56] References Cited

U.S. PATENT DOCUMENTS

| | | | |
|---|---|---|---|
| 4,492,971 | 1/1985 | Bean et al. | 357/15 |
| 4,529,455 | 7/1985 | Bean et al. | 148/175 |
| 4,661,829 | 4/1987 | Bean et al. | 357/30 |
| 4,681,773 | 7/1987 | Bean | 427/38 |
| 4,772,924 | 9/1988 | Bean et al. | 357/4 |
| 4,794,440 | 12/1988 | Capasso et al. | 357/34 |
| 4,861,393 | 8/1989 | Bean et al. | 148/33.4 |
| 5,091,767 | 2/1992 | Bean et al. | 357/60 |
| 5,096,840 | 3/1992 | Bean et al. | 437/24 |
| 5,116,455 | 5/1992 | Daly | 156/605 |
| 5,134,446 | 7/1992 | Inoue | 357/16 |
| 5,620,907 | 4/1997 | Jalali-Farahani et al. | 438/320 |
| 5,681,763 | 10/1997 | Ham et al. | 437/31 |

OTHER PUBLICATIONS

Wolf, S.; Silicon Processing for the VLSI Era vol. 2: Process Integration, Sunset Beach, CA, 1990, pp. 506–510.

C.A. King; Heterojunction Bipolar Transistors with $Si_{1-x}Ge_x$ Alloys; 1994; pp. 157–187.

Erwin J. Prinz and James C. Sturm; Analytical Modeling of Current Gain—Early Voltage Products in $Si/Si_{1-x}Ge_x/Si$ Heterojunction Bipolar Transistors: 1991 IEEE; pp. 853–856.

C.A. King, Judy L. Hoyt, Chris M. Gronet, James F. Gibbons, M.P. Scott and J. Turner; $Si/Si_{1-x}Ge_x$ Heterojunction Bipolar Transistors Produced by Limited Reaction Processing; 1989 IEEE; pp. 52–54.

*Primary Examiner*—John F. Niebling
*Assistant Examiner*—Christopher Lattin

[57] ABSTRACT

The present invention provides, in one embodiment, a method of fabricating a heterostructure bipolar transistor. This particular embodiment comprises forming a n-type doped region in a semiconductor substrate to form a collector, epitaxially forming a base on the collector, epitaxially doping the base with indium while forming the base, and forming an emitter on the base. The base is epitaxially formed, and at the same time the base is doped with indium. In other words, the indium is epitaxially incorporated within the base as the base is being formed. In addition to the indium, the base may also be epitaxially doped with boron. Since, indium is incorporated into the base with the same epitaxial process used to form the base, the damage typically associated with conventional implantation processes are not present, and thus, the high annealing temperatures to repair the damage are not required. The base can be doped and formed at the same time; thereby, saving processing time.

19 Claims, 1 Drawing Sheet

SILICON GERMANIUM HETEROSTRUCTURE BIPOLAR TRANSISTOR WITH INDIUM DOPED BASE

TECHNICAL FIELD OF THE INVENTION

The present invention is directed, in general, to a device and method for manufacturing a heterostructure bipolar transistor, and more specifically, to a method for doping the base of a transistor.

BACKGROUND OF THE INVENTION

Bipolar technology has been extensively used through the years for applications requiring high speed, high current drive, and low noise. Scaling of CMOS technology has not only drastically increased the density of CMOS integrated circuits, but it has also improved device and circuit performance. This rapid advance in MOS systems has placed increasing pressure on the ability of bipolar circuits to dominate high-performance applications. However, the same advanced fabrication techniques, such as advanced lithography and self-aligned schemes, apply to MOS devices has been also applied to bipolar devices themselves. Like scaling techniques implemented for MOS, bipolar scaling occurs in the vertical as well as the horizontal dimension. Low-energy ion implantation and preamorphization techniques have enabled thinner base regions to be constructed while tailoring the collector profile simultaneously. Rapid thermal annealing allows these thin layers to remain intact by limiting dopant diffusion through reduced thermal exposure.

Continued down scaling of homojunction bipolar transistors, however, has lead to practical limits dictated by the need to sustain sufficient current gain, among other requirements. As the base width is reduced, the base doping must be increased in order to maintain a reasonable base resistance and avoid punchthrough. Punchthrough is a condition in which the depletion regions at the base-emitter and base-collector junctions extend completely through the base, effectively shorting the emitter and collector. However, the base can be doped to only a certain level because of the significant loss in injection efficiency and thus current gain.

Moreover, as the base width in the bipolar transistor decreases, the collector-base junction voltage has an increasing effect on the neutral base width because the depletion region increases in width. This effect is sometimes referred to as base-width modulation and is more commonly known as the Early effect. The degree to which this effect impacts the operating characteristics of a bipolar transistor is represented by the Early voltage, $V_A$ (volts). A more thorough discussion of the Early effect can be found in STANLEY WOLF, SILICON PROCESSING FOR THE VLSI ERA, Vol. 2 (1990), which is incorporated herein by reference. It has been found that the value of $V_A$ can be increased by raising the doping level in the base. Higher doping decreases the penetration of the depletion region as a function of increasing collector-base reverse-bias voltage.

Typically, boron has been the primary p-type dopant in forming the base region. However, as device sizes have continued to further decrease, the possibility of using more efficient dopants has been explored. One such dopant is indium. It has been found that adding indium to a homojunction bipolar transistor results in increased collector currents and common-emitter transistor gains, excellent collector current saturation characteristics and an increase of the Early voltage when compared to boron-implanted transistors. The introduction of indium as the doping material for the base region significantly improves the function of bipolar transistors with little or no penalty in Early voltage and punch-through, see U.S. Pat. No. 5,681,763 to Ham, et al, which is incorporated herein by reference. Additionally, it is believed that the use of indium minimizes the spreading of the reverse-biased collector-base junction depletion region into the transistor base, i.e., base-width modulation.

During the indium implantation into the silicon substrate, the indium achieves a natural concentration distribution within the silicon substrate. Unfortunately, however, the impact of the indium atoms on the silicon crystalline structure damages the structure such that the damage must be annealed out. The high temperature anneal, unfortunately, has an adverse effect on the natural indium concentration distribution. Thus, it is highly desirable to avoid the high temperatures associated with present fabrication processes.

Accordingly, what is needed in the art is an improved method of fabricating a bipolar transistor which eliminates the problems associated with homojunction bipolar transistors.

SUMMARY OF THE INVENTION

To address the above-discussed deficiencies of the prior art, the present invention, in one embodiment, provides a method of fabricating a heterostructure bipolar transistor. This particular embodiment comprises forming a n-type doped region in a semiconductor substrate to form a collector, epitaxially forming a base on the collector, epitaxially doping the base with indium while forming the base, to achieve a natural concentration of the indium in the base, and forming an emitter region on the base, the base retaining the natural concentration during forming the emitter. The base is epitaxially formed, and at the same time the base is doped with indium. In other words, the indium is epitaxially formed within the base as the base is being formed. In addition to the indium, the base may also be epitaxially doped with boron. Since the indium is incorporated into the base with the same epitaxial process used to form the base, the damage typically associated with conventional implantation processes are not present, and thus, the high annealing temperatures to repair the damage are not required. The base can be doped and formed at the same time, thereby, saving processing time.

In one embodiment, epitaxially forming a base includes forming the base from silicon and germanium alloy. Additionally, as mentioned above, the present invention provides a method whereby the base is epitaxially formed and doped with indium. The epitaxial deposition processes, which are known to those who are skilled in the art, can be achieved at temperatures substantially below temperatures that are typically required to anneal out the damage caused by conventional implantation processes. Therefore, one embodiment of the present invention is directed to a process wherein the epitaxial doping is accomplished at a temperature of about 625° C.

In another embodiment, epitaxially forming a base includes forming the base to a thickness ranging from about 5 nm to about 100 nm. Of course, it should be understood that the thickness of the base may vary, depending on design parameters.

In yet another embodiment, alloying includes alloying the base to a germanium concentration that ranges from about 5% to about 40%. In one particular aspect of this embodiment, the germanium concentration may reach about 30%; that is, about 30% of the base comprises germanium. In such embodiments, the thickness of the base may be about 18 nm.

Regarding the formation of the collector, one embodiment of the present invention includes forming the n-type doped to a thickness ranging from about 100 nm to about 1 micron. The dose at which the n-type dopant may be implanted may, again, vary with design parameters. However, in one particular embodiment, forming a n-type doped includes implanting a n-type dopant such that it forms a dopant concentration ranging from about ($5\times10^{15}$ $cm^{-3}$) to about ($5\times10^{17}$ $cm^{-3}$).

In yet another embodiment, forming an emitter includes epitaxially forming a silicon layer on the base, epitaxial growth doping the silicon layer with a n-type dopant during epitaxially forming the silicon layer to a concentration of $10^{18}$ $cm^{-3}$, again doping the silicon layer with the n-type dopant to a concentration greater than $10^{20}$ $cm^{-3}$, and forming a metal layer on the silicon layer.

The present invention in yet another aspect provides a heterostructure bipolar transistor, comprising a n-type doped region in a semiconductor substrate that forms a collector, an epitaxially formed base located on the collector wherein the base has indium epitaxially incorporated therein, and an emitter formed on the base.

The foregoing has outlined, rather broadly, preferred and alternative features of the present invention so that those who are skilled in the art may better understand the detailed description of the invention that follows. Additional features of the invention that form the subjects of the present invention's claims are described below. Those who are skilled in the art should appreciate that they can readily use the disclosed conception and specific embodiment as a basis for designing or modifying other structures for carrying out the same purposes of the present invention. Those who are skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
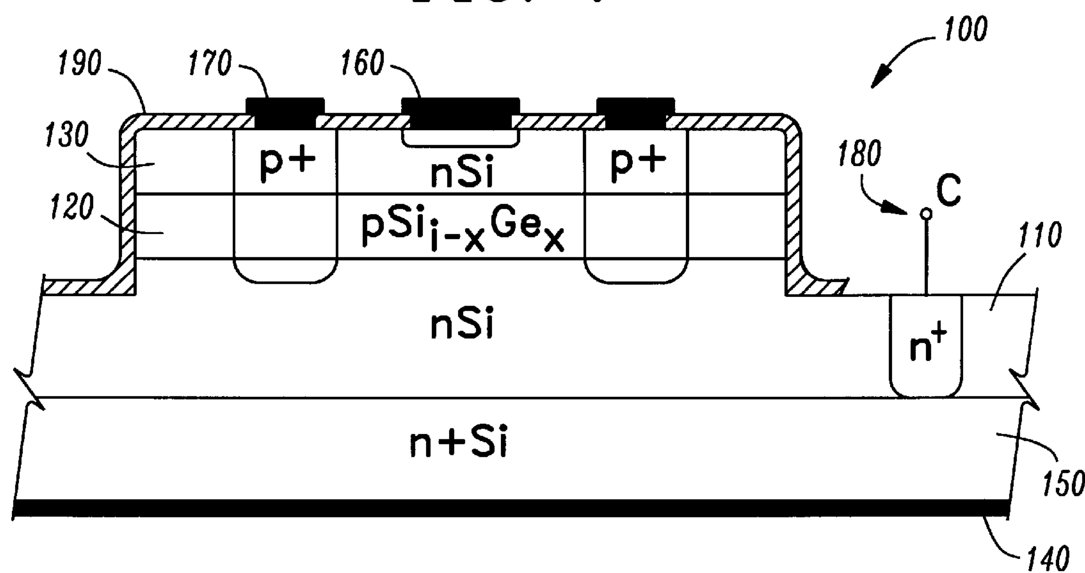
FIG. 1 illustrates a sectional view of one embodiment of an exemplary heterostructure npn bipolar transistor.

Referring initially to FIG. 1, illustrated is a sectional view of one embodiment of an exemplary heterostructure npn bipolar transistor 100 constructed according to the present invention. It should be noted that the present invention could also be applicable to pnp type devices. The heterostructure npn bipolar transistor (HBT) 100 of this exemplary embodiment, comprises a collector 110 a small bandgap (SiGe) base 120 and an emitter 130. The specifics for fabricating each of these structures is discussed in more detail below. This particular embodiment further includes a p-type substrate 140, an n+ substrate 150, an emitter contact 160, a base contact 170, a collector contact 180, and a dielectric layer 190. The p-type substrate 140 is typically the top surface of a silicon wafer. The p-type substrate 140 has at least one n+ substrate region 150 formed on it. In one embodiment of the present invention, the n+ substrate region 150 is formed upon the p-type substrate 140. The n+ substrate region 150 typically comprises silicon and may be doped with a n-type dopant, such as antimony or Arsenic to a resistivity between 0.001 and 0.020 Ω·cm. Following a 900° C., 60 second $H_2$ clean, the collector 110 may be grown of silicon by rapid thermal epitaxy at 800° C.–1000° C. In the illustrated embodiment, the base 120 is formed of a small bandgap material, such as silicon-germanium (SiGe); however, it should be understood that other small bandgap (SiGeC) materials known to those who are skilled in the art may also be used in the present invention.

Figure 2:
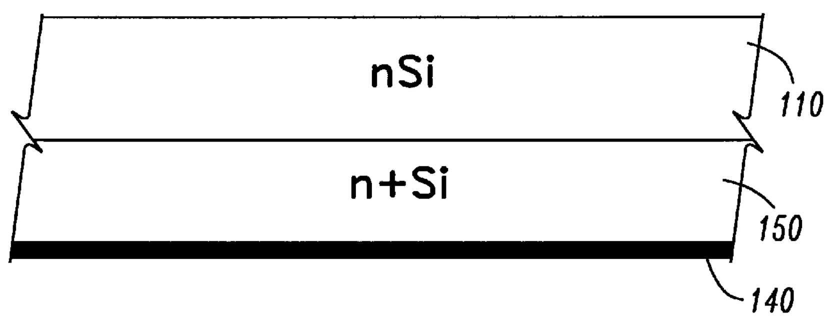
FIG. 2 illustrates a sectional view of the wafer of FIG. 1 with manufacture completed through the collector level.

Referring now to FIG. 2, illustrated is a sectional view of the wafer of FIG. 1 with manufacture completed through the collector 110. The collector 110 may be formed by chemical vapor deposition (CVD). A typical range of thickness for the collector 110 is from about 100 nm to about 1000 nm. The lower end of this range may be used for high-speed devices, while the upper end of this range may be used for power devices. In an advantageous embodiment, the collector 110 is epitaxially doped with arsenic, at a doping level that typically lies in the range from about $10^{16}$ $cm^{-3}$ to about $10^{18}$ $cm^{-3}$. The collector 110 will typically have a reduced doping level in its upper part to increase the breakdown voltage of the resulting device. Those who are skilled in the art are familiar with the specifics of deposition and doping with CVD, as set forth in U.S. Pat. Nos. 4,529,455 and 5,620,907, which are incorporated herein by reference. The n-type doped collector 110 may be grown to an exemplary thickness ranging from about 100 nm to about 1 micron. However, the thickness of the collector 110 may vary from the exemplary thickness, depending on the design size of the device. In an alternative embodiment, the collector 110 may be implanted with an n dopant to a level from about $5\times10^{15}$ $cm^{-3}$ to about $5\times10^{17}$ $cm^{-3}$.

Figure 3:
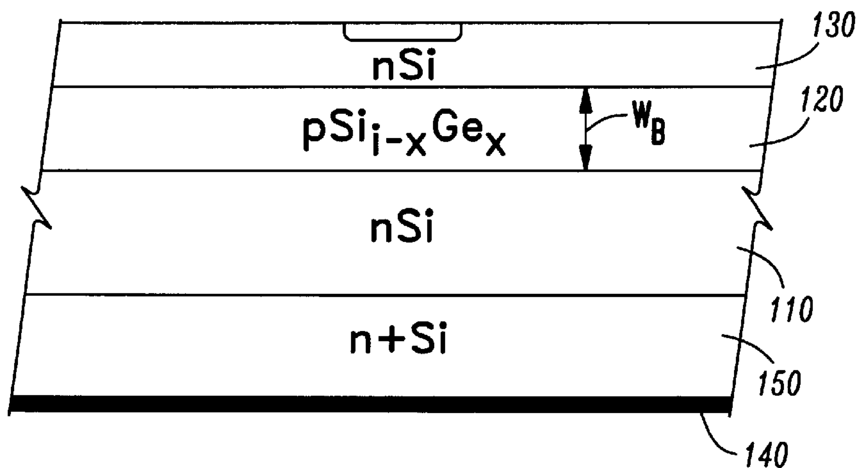
FIG. 3 illustrates a sectional view of the heterostructure bipolar transistor of FIG. 1 with manufacturing completed through the emitter level.

Referring now to FIG. 3, illustrated is a sectional view of the heterostructure bipolar transistor of FIG. 1 with manufacturing completed through the emitter level. In one advantageous embodiment, the base 120 is doped with indium that functions as a p-type dopant. The source of the indium may be an indium-based compound, such as trimethyl indium. In one advantageous embodiment of the present invention, the indium is incorporated at the same time as the base 120 is epitaxially grown. In yet another embodiment, boron also may be epitaxially incorporated into the base 120 along with indium and during the formation of the base 120. The concentration of the indium to boron may vary. However, in one advantageous embodiment, the indium concentration may be about $10^{17}$–$10^{20}$, while the boron concentration may be about $10^{17}$–$10^{20}$.

The base 120 is grown from a silicon and germanium alloy to a thickness ($W_B$) ranging from about 5 nm to about 100 nm by CVD at about 625° C. Again, these thicknesses may vary beyond this exemplary range, depending on the design rules. In an exemplary embodiment, the germanium concentration in the silicon germanium alloy of the base 120 may range from about 5% to about 40%. In a particularly advantageous embodiment, however, the germanium concentration in the base 120 is about 30%. In yet another advantageous embodiment, the base 120 is epitaxially grown to a thickness of about 18 nm.

It is believed that adding indium to a heterjunction bipolar transistor will result in increased collector currents and common-emitter transistor gains, excellent collector current saturation characteristics and an increase of the Early voltage when compared to transistors where the base is doped only with boron. Additionally, it is believed that the use of indium will minimize the spreading of the reverse-biased collector-base junction depletion into the transistor base, i.e., base-width modulation (same as increasing Early voltage).

During the indium doping into the silicon substrate, the indium achieves a natural concentration distribution within the silicon substrate. Because the indium is incorporated at the same time as the base 120 material is epitaxially grown, there is little or no damage to the silicon crystalline structure. Thus, there is no need to anneal the transistor device. As such, the high temperature anneal prevalent in prior art devices is not necessary in the present invention. Therefore, there are no adverse effects on the natural indium concentration distribution within the base 120.

From the following, it is believed that for two heterojunction bipolar transistors with identical emitter profiles and base profiles, the structure with the indium-doped base will have a higher gain ($h_{fe}$) and collector current ($I_c$), with no penalty in the Early voltage ($V_A$), compared with boron-doped base. Furthermore, it will be shown that for two heterojunction bipolar structures with identical collector currents ($I_c$) and gain ($h_{fe}$), the structure that uses indium as a base dopant (as opposed to boron) will have a much larger Early voltage ($V_A$).

For a transistor with base width $W_B$ and base acceptor doping $N_B$, the Early voltage is $$V_a = \frac{qN_B W_B}{c_{BC}} \tag{1}$$

The transistor collector current ($I_c$) is $$I_C = \frac{qAn_{ib}^2 D}{\int_0^{W_B} p\,dx} e^{\frac{qV_{BE}}{\kappa T}} \tag{2}$$

where q, A, $n_{ib}$, D are constants, and $V_{BE}$ is the applied voltage. The integral $$\int_0^{W_B} p\,dx$$

is the Gummel number, where p is the hole concentration in the quasi-neutral base. Therefore, collector current can be increased by reducing the Gummel number, that is by reducing the integrated hole concentration in the quasi-neutral base. When the base dopant is boron, which has an acceptor state 45 meV from the valence band, at typical operating temperatures all of these acceptor states are ionized and the hole concentration is equal to the doping, $p \approx N_B$.

In the case of boron as the base dopant, the collector current is inversely proportional to the base doping:

$$I_C \approx \frac{qAn_{ib}^2 D}{N_B W_B} e^{\frac{qV_{BE}}{\kappa T}} \tag{3}$$

The base current is given by (assuming a modern transistor where the base current is due to hole injection into the emitter), $$I_B = \frac{qAn_{ib}^2 D}{N_E X_E} e^{\frac{qV_{BE}}{\kappa T}} \tag{4}$$

where $X_E = W_E$ or $X_E = L_E$ depending whether the emitter width ($W_E$) is larger than the hole diffusion length ($L_E$). For our purposes it is kept constant. Bipolar gain is $$h_{fE} \approx \frac{I_C}{I_B} \approx \frac{N_E X_E}{N_B W_B} \tag{5}$$

where the base dopant is boron.

If indium is used as a base dopant, equation (2) still holds, $$I_C = \frac{qAn_{ib}^2 D}{\int_0^{W_B} p\,dx} e^{\frac{qV_{BE}}{\kappa T}} \tag{2}$$

But $p \neq N_B$; as a matter of fact $p << N_B$. This is because the indium acceptor state is 156 meV above the valence band, and does not fully ionize at room temperature.

$$N^- = \frac{N_B}{1 + \frac{pg_A}{N_V} e^{\frac{\Delta E_\epsilon}{\kappa T}}} \tag{6}$$

In the case of quasi-neutral base $p = N^-$ ionized acceptor, equation (6) reduces to a quadratic equation in p, and the solution is:

$$p = \frac{-\frac{N_v}{ge^{\frac{\Delta E_{IN}}{\kappa T}}} + \sqrt{\frac{N_v 2}{g^2 e^{\frac{2\Delta E_{IN}}{\kappa T}}} + \frac{4N_B - -N_v}{g_A e^{\frac{\Delta E_{IN}}{\kappa T}}}}}{2} \tag{7}$$

where $N_V = 1.02\times10^{19}$ cm$^{-3}$, g=4, $\Delta E_{IN} = 0.156$ eV, $N_B$=base doping. For $N_B = 5\times10^{18}$ cm$^{-3}$ (very heavy base doping) $p \approx 1.7\times10^{17}$ cm$^{-3}$, therefore, $p << N_B$. This will result in a much larger $I_c$ for indium doped base as compared to boron doped base; see equations (2), (3) and (8).

$$I_C(\text{indium}) \propto \frac{1}{PW_B} \gg \frac{1}{N_B W_B} \propto I_C(\text{boron}) \tag{8}$$

For transistor gain $h_{fe}$:

$$h_{fE\Delta} = \frac{I_C}{I_B} \tag{9}$$

$$\frac{I_C(\text{indium})}{I_B} \gg \frac{I_C(\text{boron})}{I_B} \text{ with } I_B \text{ same for both;}$$

$h_{fE}(\text{indium}) >> h_{fE}(\text{boron})$.

The following equations will show that these devices will have nearly identical Early voltages. Early voltage for boron and indium-doped bases are substantially identical since Early voltage depends on the reverse-biased characteristics of a collector-base junction. When the junction is reverse biased, the junction region is depleted of carriers (holes and electrons). Using equation (6):

$$N^- = \frac{N_B}{1 + \frac{pg_A}{N_V} e^{\frac{\Delta E_\epsilon}{kT}}} \quad (10)$$

results in $N^- = N_B$. Then, $$A = \frac{q^{N-W_B 2}}{\epsilon_s} = \frac{g^{N_B W}}{\epsilon_s} \quad (11)$$

Thus, for a constant Early voltage $V_A$, $h_{fe}$ can be increased by using indium.

Now it will be shown two devices (one with indium, the other with boron base) with identical gains ($h_{fe}$) that the device with indium base has a much larger $V_A$. Let $W_B$ be constant and emitter profiles be identical.

$$h_{fE}(\text{boron}) = \frac{1}{N_B W_B} = \frac{1}{PW_B} = h_{fE}(\text{indium}) \quad (12)$$

then $N_B(\text{boron}) << N_B(\text{indium})$. That is, to get the same gain, the indium base can be doped much higher. Then, $$V_A(\text{boron}) = \frac{qN_B(\text{boron})W_B 2}{\epsilon_s} \ll \frac{qN_B(\text{indium})W_B 2}{\epsilon_s} \quad (13)$$

In this analysis, band gap narrowing in the base has been ignored.

In summary, using indium as the acceptor dopant for the npn-bipolar transistor p-base region, has the following advantages:

(1) Since indium diffuses much slower than boron (the conventional base dopant) it will be possible to fabricate transistors with narrower base widths ($W_B$) and hence much improved base transit time and $f_t$.

(2) Relative to boron, indium has a deeper acceptor level. This property of indium is used to obtain a reduced Gummel number in the quasi-neutral base, while the base cannot be punched-through since full ionization of indium acceptor states is achieved in depletion regions. This results in improved $h_{fe} \times V_A$ (gain-Early voltage product) over boron doped base structures.

Returning now to FIG. 3, in an advantageous embodiment, following the formation of the doped base 120, the emitter 130 is epitaxially formed. The emitter 130 is preferably a silicon layer doped with a n-type dopant to a level of about $10^{18}$ $cm^{-3}$. Upon completion of forming the emitter silicon layer 130, an in situ n+ doped polysilicon contact or heavily n+ doped epitaxial layer 200 is formed on the emitter layer 130. This polysilicon contact or heavily n+ doped epitaxial layer 200 is additionally doped to a concentration greater than about $10^{20}$ $cm^{-3}$.

Referring again to FIG. 1. One who is skilled in the art is familiar with the conventional methods used to form the emitter, base, and collector contacts, 160, and 170,180 respectively, and the dielectric layer 190. Thus, a npn heterostructure bipolar transistor has been formed by CVD or rapid thermal epitaxy, obviating the need for a high temperature rapid thermal anneal which could damage the doping distribution in the device.

From the foregoing it can be seen that the present invention provides a method of fabricating a heterostructure bipolar transistor. In a particular embodiment, the method comprises forming a n-type doped in a semiconductor substrate to form a collector, epitaxially forming a base on the collector, epitaxially doping the base with indium while forming the base, and forming an emitter region on the base. As the base is formed by rapid thermal epitaxy (CVD), the base is doped with an indium gaseous species. In other words, the indium is epitaxially incorporated within the base as the base is being formed. In addition to the indium, the base may also be epitaxially doped with boron. Since, both the doped base and the are formed with the same epitaxial process, the damage typically associated with conventional implantation processes are not present, and thus, the high annealing temperatures to repair the damage are not required. The base can be doped and formed at the same time, thereby, saving processing time.

Although the present invention has been described in detail, those who are skilled in the art should understand that they can make various changes, substitutions and alterations herein without departing from the spirit and scope of the invention in its broadest form.

What is claimed is:

1. A method of fabricating a heterostructure bipolar transistor, comprising:

forming a n-type doped collector in a semiconductor substrate;

epitaxially forming a base on said collector, said base comprising SiGe;

epitaxially doping said base with indium while forming said base, to achieve a natural concentration of said indium in said base; and forming an emitter on said base, said base retaining said natural concentration during forming said emitter.

2. The method as recited in claim 1 wherein epitaxially doping includes epitaxially doping said base with boron.

3. The method as recited in claim 1 wherein epitaxially doping includes doping at a temperature of about 625° C.

4. The method as recited in claim 1 wherein epitaxially forming a base includes forming said base to a thickness ranging from about 5 nm to about 100 nm.

5. The method as recited in claim 1 wherein epitaxially forming a base includes forming said base with a germanium concentration that ranges from about 5% to about 40%.

6. The method as recited in claim 5 wherein epitaxially forming a base includes forming said base with a germanium concentration of about 30%.

7. The method as recited in claim 6 wherein epitaxially forming a base includes forming said base to a thickness of about 18 nm.

8. The method as recited in claim 1 wherein a n-type doped collector includes forming said n-type doped collector to a thickness ranging from about 100 nm to about 1 micron.

9. The method as recited in claim 1 wherein forming a n-type doped collector includes forming a n-type dopant at a dose of ($5 \times 10^{15}$ $cm^{-3}$) to ($5 \times 10^{17}$ $cm^{-3}$).

10. The method as recited in claim 1 wherein forming an emitter includes:

epitaxially forming a silicon layer on said base;

epitaxially doping said silicon layer with a n-type dopant during epitaxially forming said silicon layer to a concentration of $10^{18}$ $cm^{-3}$;

again doping said silicon layer with said n-type dopant to a concentration greater than $10^{20}$ $cm^{-3}$; and forming a metal layer on said silicon layer.

11. A heterostructure bipolar transistor, comprising:

a n-doped in a semiconductor substrate that forms a collector;

an epitaxially formed base comprising SiGe, located on said collector, said base having a natural concentration of indium epitaxially incorporated therein; and an emitter formed on said base, said base retaining said natural concentration during formation of said emitter.

12. The heterostructure bipolar transistor recited in claim 11 wherein said base further comprises boron epitaxially incorporated therein.

13. The heterostructure bipolar transistor as recited in claim 11 wherein said indium is epitaxially formed at a temperature of about 625° C.

14. The heterostructure bipolar transistor as recited in claim 11 wherein said base has a thickness ranging from about 10 nm to about 100 nm.

15. The heterostructure bipolar transistor as recited in claim 11 wherein said base includes germanium and a concentration of said germanium ranges from about 5% to about 40%.

16. The heterostructure bipolar transistor as recited in claim 15 wherein said concentration of said germanium is about 30%.

17. The heterostructure bipolar transistor as recited in claim 11 wherein said base has a thickness of about 18 nm.

18. The heterostructure bipolar transistor as recited in claim 11 wherein said collector has a thickness ranging from about 100 nm to about 1 micron.

19. The heterostructure bipolar transistor as recited in claim 11 wherein said collector has a dopant concentration that ranges from about ($5\times10^{15}$ $cm^{-3}$) to about ($5\times10^{17}$ $cm^{-3}$).

* * * * *